United States Patent
Song et al.

(10) Patent No.: US 7,876,148 B2
(45) Date of Patent: Jan. 25, 2011

(54) LOW PASS FILTER AND LOCK DETECTOR CIRCUIT

(75) Inventors: Taek-Sang Song, Gyeonggi-do (KR); Kyung-Hoon Kim, Gyeonggi-do (KR); Dae-Han Kwon, Gyeonggi-do (KR); Dae-Kun Yoon, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 12/344,552

(22) Filed: Dec. 28, 2008

(65) Prior Publication Data
US 2009/0168944 A1    Jul. 2, 2009

(30) Foreign Application Priority Data
Dec. 28, 2007    (KR) .................... 10-2007-0140412

(51) Int. Cl.
*H03L 7/093*    (2006.01)
*H03L 7/095*    (2006.01)
(52) U.S. Cl. .................. 327/558; 327/160; 327/175; 331/DIG. 2
(58) Field of Classification Search .............. None
See application file for complete search history.

(56) References Cited
U.S. PATENT DOCUMENTS

| | | | |
|---|---|---|---|
| 3,936,739 A * | 2/1976 | Hogg | 377/50 |
| 4,814,725 A * | 3/1989 | Vitiello | 331/1 A |
| 6,029,250 A | 2/2000 | Keeth | |
| 6,373,304 B1 * | 4/2002 | Drost et al. | 327/157 |
| 6,462,594 B1 * | 10/2002 | Robinson et al. | 327/159 |
| 6,912,680 B1 | 6/2005 | Keeth | |
| 6,927,635 B2 * | 8/2005 | Miki et al. | 331/1 A |
| 7,030,688 B2 * | 4/2006 | Dosho et al. | 327/558 |
| 7,372,339 B2 * | 5/2008 | Fu | 331/16 |
| 7,495,517 B1 * | 2/2009 | Hoang et al. | 331/16 |
| 2006/0066759 A1 | 3/2006 | Ikuma et al. | |
| 2010/0060348 A9 * | 3/2010 | Lee et al. | 327/552 |

FOREIGN PATENT DOCUMENTS

| JP | 04-107011 | 4/1992 |
|---|---|---|
| JP | 08-162882 | 6/1996 |
| KR | 1020050007821 A | 1/2005 |

OTHER PUBLICATIONS

Notice of Allowance issued from Korean Intellectual Property Office on Apr. 30, 2009 with an English Translation.

* cited by examiner

*Primary Examiner*—Lincoln Donovan
*Assistant Examiner*—Terry L Englund
(74) *Attorney, Agent, or Firm*—IP & T Group LLP

(57) ABSTRACT

A low pass filter includes a driver unit configured to output a voltage proportional to an input pulse width, a charge/discharge unit configured to charge the output voltage of the driver unit, a comparator unit configured to compare an output voltage of the charge/discharge unit with a reference value to output a square wave signal, and a switching unit configured to switch the charge/discharge unit to an operation state, based on a bandwidth expansion signal.

12 Claims, 4 Drawing Sheets

LOW PASS FILTER AND LOCK DETECTOR CIRCUIT

CROSS-REFERENCE TO RELATED APPLICATIONS

The present invention claims priority of Korean patent application number 10-2007-0140412, filed on Dec. 28, 2007, which is incorporated by reference in its entirety.

BACKGROUND OF THE INVENTION

The present invention relates to a low pass filter with adjustable bandwidth, and to a lock detector circuit that indicates the generation of a desired clock whose frequency is locked in a feedback system such as a phase locked loop or a delay locked loop.

The phase locked loop (PLL) and delay locked loop (DLL) are two representative feedback systems. A feedback system is used in a synchronous memory device to transmit data to external devices by using internal clock signals locked in synchronization with an external clock signal inputted from an external device such as a memory controller. For stable data transmission between the semiconductor memory device and the memory controller, temporal synchronization between a reference clock signal and the data is important.

The feedback system includes a lock detector circuit indicating whether the phase and frequency of a clock signal having a particular frequency are locked to those of a reference clock signal. The lock detector circuit outputs a lock signal indicating the phase locking when a phase difference between two signals is inputted to a phase frequency detector (PFD), that is, a clock signal having an arbitrary frequency and a reference clock signal, is maintained for a certain period of the reference clock signal. The lock signal indicating the locking of the feedback system is transferred to the next circuit, and an operation after PLL locking is performed.

As illustrated in FIG. 1, when the feedback system is in a locking state, output signals UP and DN of the phase frequency detector are outputted in a pulse form having a narrow pulse width (constant pulse width). However, as illustrated in FIG. 2, when the feedback system is in an unlocking state, the pulse widths of the output signals UP and DN of the phase frequency detector are rapidly increased. When the pulse widths are changed as illustrated in FIG. 2, the lock detector circuit cannot output the lock signal indicating the phase locking.

FIG. 3 is a circuit diagram of a typical low pass filter determining whether to output the lock signal in the lock detector circuit. Referring to FIG. 3, the typical low pass filter includes an NMOS transistor N1 and a PMOS transistor P2 connected in series between a power supply voltage terminal VDD and a ground voltage terminal. The NMOS transistor N1 is turned on in response to an input clock signal of a logic high level, and the PMOS transistor P2 is turned on in response to an input clock signal of a logic low level. The input clock signal is applied to gates of the two transistors N1 and P2. Furthermore, a PMOS transistor P1 is connected between the power supply voltage terminal VDD and the PMOS transistor P2 and acts as a resistive element with respect to the supply voltage. A gate of the PMOS transistor P1 is connected to the ground voltage terminal.

One terminal of a capacitor C is connected to a node NODE1 where drains of the two transistors N1 and P2 are commonly connected, and the other terminal of the capacitor C is connected to the ground voltage terminal.

In addition, a comparator using a Schmitt trigger S1 is connected to the node NODE1, and an output of the Schmitt trigger S1 is fed back to a gate of a PMOS transistor P3 connected between the power supply voltage terminal and the node NODE1. The output of the Schmitt trigger S1 is outputted as a reset signal RESET through an inverter IV1.

In operation of the typical low pass filter, the NMOS transistor N1 and the PMOS transistor P2 are turned on in response to the input clock signal of the logic high level and the input clock signal of the logic low level. The supply voltage, passing through the PMOS transistor P1 acting as the resistive element, is supplied to the node NODE1 according to the turn-on characteristics of the turned-on transistors. In this case, the supply voltage supplied to the node NODE1 is charged into the capacitor C.

Meanwhile, as illustrated in FIG. 4, when the pulse width of the input clock signal is long, the turn-on characteristics of the transistors P2 and N1 become greater than the case where the low signal is outputted from the low pass filter. Therefore, the voltage applied to the node NODE1 exceeds the limit value of the Schmitt trigger S1, despite it's passing through the RC charge/discharge circuit. In this case, the output of the low pass filter goes to a logic high level.

That is, the low pass filter filters the input pulse signal during a period where the pulse width of the input clock signal is short. When the phase locked loop is in an unlocking state, the output signals UP and DN of the phase frequency detector, which have long pulse widths, are inputted to the low pass filter. Thus, the low pass filter cannot filter the signals sufficiently and outputs a high signal. The generated high signal indicates the unlocking state of the lock detector circuit.

On the other hand, when the phase locked loop is in a locking state, the output signals UP and DN of the phase frequency detector, which have short pulse widths, are inputted to the low pass filter. Thus, the low pass filter filters the signals sufficiently and outputs a low signal. The generated low signal indicates the locking state of the lock detector circuit.

Meanwhile, when reading data from the memory device (for example, DRAM) or writing data to the memory device, data training is performed for controlling the mismatching of timing between data, and clock training is performed for controlling timing between clocks. The data training is a technology that controls timing between data by using data patterns known to the controller and the memory device when data is written to the memory device (write training) and data is read from the memory device (read training). In addition, the clock training controls the timing of clocks to be used in the memory device. The clock training operation and the data training operation are used in a specific memory device, especially, in order to increase a data valid window.

The clock training operation is controlled in the PLL locking state. However, if the reference clock is delayed with a constant value in order for the clock training, the pulse widths of the output signals UP and DN of the phase frequency detector are instantaneously increased. Thus, the low pass filter generates a high signal and performs an erroneous operation to determine that the PLL circuit is in an unlocking state.

Such an erroneous operation is also applied to a case where jitter contained in the reference clock signal or the feedback clock signal of the voltage controlled oscillator (VCO) is large, so that the phase locked loop is determined as being in an unlocking state.

Therefore, although the PLL circuit is in the locking state, the low pass filter cannot filter the signals sufficiently when the frequency variation is great, just like in the case jitter contained in the clock training operation or the reference clock signal and the feedback clock signal of the VCO is great, so that the phase locked loop performs an erroneous operation to determine the PLL circuit as being in the unlocking state.

Furthermore, due to the erroneous operation to determine the phase locked loop as being in the unlocking state, it is impossible to perform the operation after the locking of the phase locked loop.

SUMMARY OF THE INVENTION

Embodiments of the invention are directed to a low pass filter that is capable of adjusting its bandwidth according to the purpose of use. Embodiments of the invention are also directed to a lock detector circuit capable of generating a stable PLL locking signal by filtering an input pulse at the adjusted bandwidth according to the purpose of use.

The low pass filter of the invention greatly adjusts the bandwidth when frequency variation of a clock signal is great such as in data training and when great jitter occurs.

In accordance with an aspect of the invention, a low pass filter includes a driver unit configured to output a voltage proportional to an input pulse width, one or more charge/discharge units configured to charge an output voltage of the driver unit, a comparator unit configured to compare an output voltage of the charge/discharge unit with a reference value to output a square wave signal, and a switching unit configured to control one of the charge/discharge units to an operation state, based on a bandwidth expansion signal.

In accordance with another aspect of the invention, a lock detector circuit includes a phase frequency detector configured to output a pulse signal, a first low pass filter configured to adjust a bandwidth according to a bandwidth expansion signal and filter a first pulse signal outputted from the phase frequency detector according to the adjusted bandwidth, a second low pass filter configured to control a bandwidth according to a bandwidth expansion signal and filter a second pulse signal outputted from the phase frequency detector according to the adjusted bandwidth, a timer configured to output an enable signal after predetermined toggling, and a counter configured to generate a locking signal by toggling the timer after predetermined time by using outputs of the first and second low pass filters as a reset signal.

DESCRIPTION OF SPECIFIC EMBODIMENTS

Other objects and advantages of the present invention can be understood by the following description of embodiments of the invention.

Figure 1:
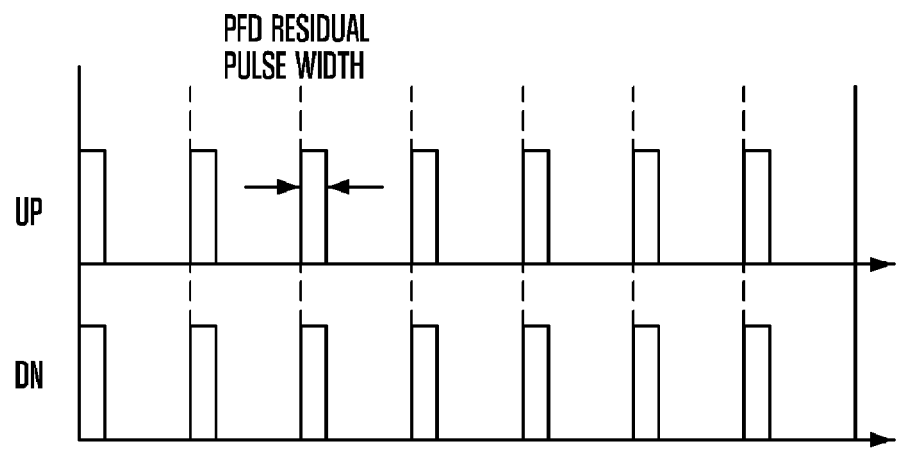
FIG. 1 is a diagram of an exemplary pulse signal in a typical PLL locking state.
Figure 2:
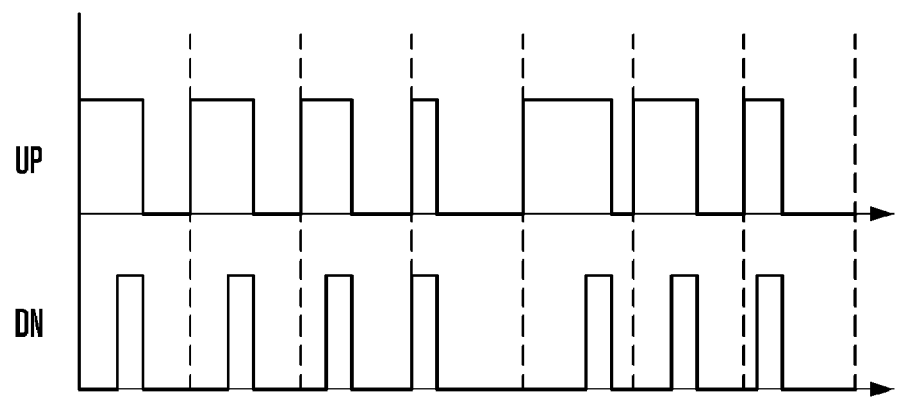
FIG. 2 is a diagram of an exemplary pulse signal in a typical PLL unlocking state.
Figure 3:
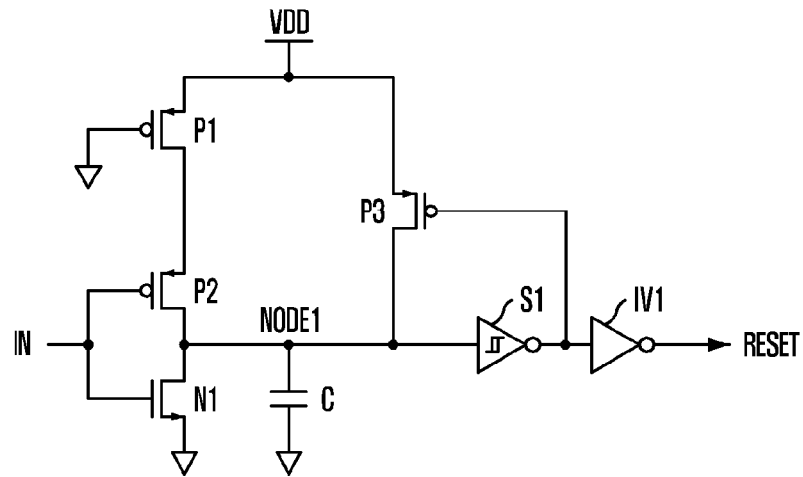
FIG. 3 is a detailed circuit diagram of a typical low pass filter.
Figure 4:
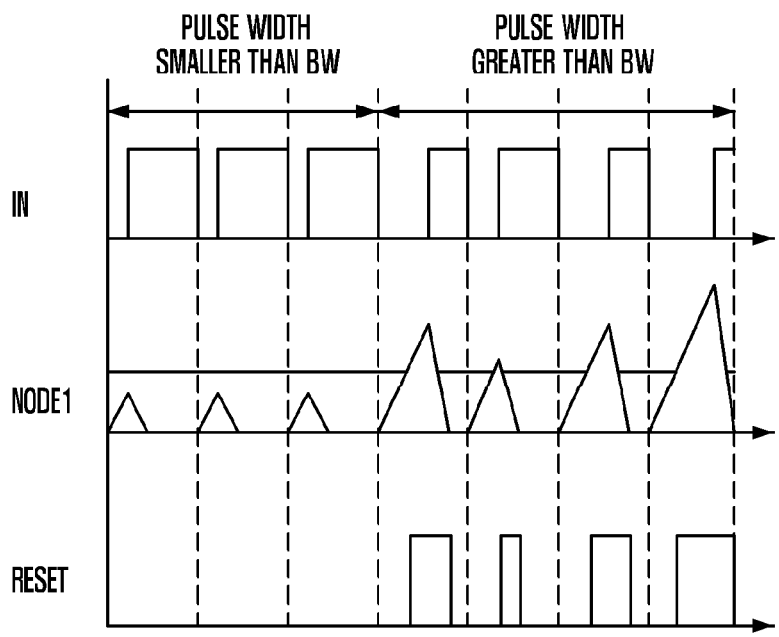
FIG. 4 is a diagram of an exemplary pulse signal in an operation state of a typical low pass filter.
Figure 5:
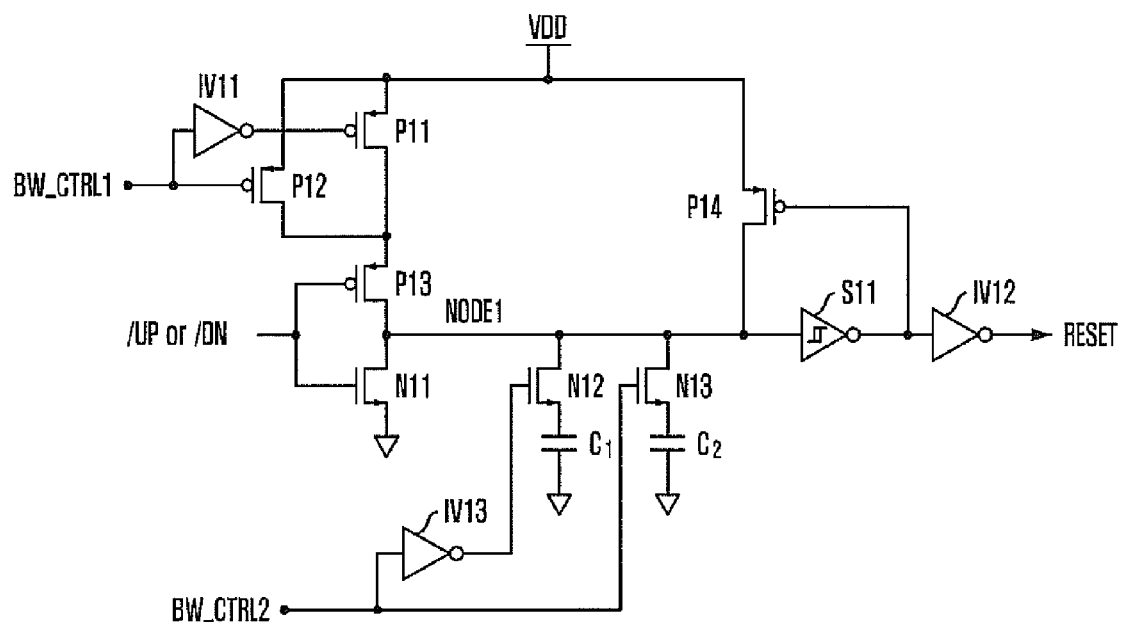
FIG. 5 is a detailed circuit diagram of a low pass filter in accordance with an embodiment of the invention.

FIG. 5 is a circuit diagram of a low pass filter in accordance with an embodiment of the invention.

Referring to FIG. 5, the low pass filter in accordance with the embodiment of the invention includes an NMOS transistor N11 and a PMOS transistor P13 connected in series between a power supply voltage terminal VDD and a ground voltage terminal. The NMOS transistor N11 is turned on in response to an input clock signal of a logic high level, and the PMOS transistor P13 is turned on in response to the input clock signal of a logic low level. The input clock signal is applied to gates of the two transistors N11 and P13.

In addition, a resistive element with respect to the supply voltage is connected between the power supply voltage terminal VDD and the PMOS transistor P13. The resistive element is implemented with a PMOS transistor. Specifically, the resistive element is implemented with two PMOS transistors P11 and P12 connected in parallel between the power supply voltage terminal VDD and the PMOS transistor P13. That is, a control signal BW_CTRL1 based on bandwidth expansion signal is inputted to gates of the PMOS transistors P11 and P12. The control signal BW_CTRL1 is a control signal which is generated from a test mode register set (TMRS) in order to control the bandwidth in a test mode operation before a PLL operation is started, and also a control signal corresponding to the bandwidth set in the current PLL system according to a preset program.

One of the two PMOS transistors P11 and P12 must be selectively operated. That is, as described above, in a case where a pulse signal having a normal pulse width is inputted, if the PMOS transistor P11 having a first resistance is operated, the PMOS transistor P12 having a resistance greater than the first resistance is controlled to operate when the clock training or the frequency variation is needed. Therefore, the signal applied to the gate of the PMOS transistor P11 has a state opposite to that of the signal applied to the gate of the PMOS transistor P12.

To this end, the control signal BW_CTRL1 based on the bandwidth expansion signal is directly applied to the gate of the PMOS transistor P12, and the inverted control signal outputted from the inverter IV11 is applied to the PMOS transistor P11. The resistances of the PMOS transistors P11 and P12 are inversely proportional to the size of the transistor. That is, the resistance of the transistor having the low turn-on characteristic is small, and the resistance of the transistor having the high turn-on characteristic is large.

Capacitors are connected to the resistive element at a node NODE1 where drains of the two transistors N11 and P13 are commonly connected, thereby configuring an RC charge/discharge circuit. That is, two capacitors C1 and C2 are connected in parallel at the node NODE1 and operate under control of switching elements. Therefore, the capacitor C1 is connected between the node NODE1 and the ground voltage terminal, and the capacitor C2 is connected between the node NODE1 and the ground voltage terminal. The capacitor C2 is operated when the normal pulse is inputted, and the capacitor C1 is operated when the frequency variation is great, just like in the clock training operation. Therefore, the size of the capacitor C1 is larger than that of the capacitor C2.

An NMOS transistor N12 is connected between the capacitor C1 and the node NODE1, and an NMOS transistor N13 is connected between the capacitor C2 and the node NODE1. A bandwidth expansion control signal BW_CTRL2 is applied to the gate of the NMOS transistor N12 through an inverter IV13, and the bandwidth expansion control signal BW_CTRL2 is directly applied to the gate of the NMOS transistor N13. Therefore, the two transistors N12 and N13 are operated in opposite states. The bandwidth expansion control signal BW_CTRL2 is a control signal which is generated from a test mode register set (TMRS) (not shown) in order to control the bandwidth in a test mode operation before a PLL operation is started, and also a control signal corresponding to the bandwidth set in the current PLL system according to a preset program.

In addition, a comparator using a Schmitt trigger S11 is connected to the node NODE1, and an output of the Schmitt trigger S11 is fed back to a gate of a PMOS transistor P14 connected between the power supply voltage terminal VDD and the node NODE1. The output of the Schmitt trigger S11 is outputted as a reset signal RESET through an inverter IV12.

The bandwidth expansion control signals BW_CTRL1 and BW_CTRL2 used herein are provided from a TMRS (control unit) (not shown). The TMRS generates the bandwidth expansion control signals, before the PLL operation, when a great frequency variation occurs or an operation requiring the PLL locking operation is performed. The bandwidth expansion control signals may also be generated when the frequency of the clock is greatly varied, just like when jitter contained in the reference clock signal or the feedback clock signal is large. In order to generate the bandwidth expansion control signals, it is necessary to first check whether the current operation is the clock training operation or the operation in which the frequency variation of the clock is great because jitter contained in the clock signal is great. A detection value of the checking process is provided to an arbitrary circuit of the memory device.

The two control signals may be provided as the same signal so that the resistive element and the capacitor are selected at the same time, or the two control signals may be provided as different signals so that the resistive element and the capacitor are selected separately. In the current embodiment, the resistive element and the capacitor are selected separately. That is, when the bandwidth variation is needed, the small-sized transistor is turned on so that it has a large resistance. In this case, when the capacitor has enough capacitance even when its capacitance is small, the capacitor having a small capacitance may be selected. However, when a larger RC delay is needed, the RC delay time can be ensured by selecting the resistive element having a large resistance and the capacitor having a large capacitance.

An operation of the low pass filter in accordance with the embodiment of the invention now will be described. First, the resistive element and the capacitor to be operated as the RC charge/discharge circuit are selected. In a normal case where the input clock signal has a short pulse width, the resistive element P11 having a small resistance and the capacitor C2 having a small capacitance are selected. To this end, the TMRS provides the bandwidth expansion signals BW_CTRL1 and CTRL2 of logic high level.

The bandwidth expansion signal BW_CTRL1 of the logic high level turns off the PMOS transistor P12 and turns on the PMOS transistor P11. Therefore, the resistive element becomes turned-on because the PMOS transistor P11 having a small resistance is selected.

In addition, the bandwidth expansion signal BW_CTRL2 of the logic high level is inverted by the inverter IV13 and provided to the NMOS transistor N12 as the low signal. Thus, the NMOS transistor N12 is turned off. Furthermore, the bandwidth expansion signal BW_CTRL12 of the logic high level turns on the NMOS transistor N13. Therefore, the capacitor C2 becomes operable through the turned-on NMOS transistor N13.

Due to the control of the bandwidth expansion signals, the RC charge/discharge circuit is implemented with the resistive element P11 having a small resistance and the capacitor C2 having a small capacitance. In this case, even when the RC delay time is short, the pulse signal having a short pulse width can be sufficiently filtered.

In the state when such a control operation is performed, the NMOS transistor N11 or the PMOS transistor P13 are turned on according to the input clock signal of the logic high or low level. The supply voltage passing through the resistive element P11 is supplied to the node NODE1 according to the turn-on characteristics of the turned-on transistors. In this case, the supply voltage supplied to the node NODE1 is charged into the capacitor C2.

In a period where the pulse width is short, the voltage applied to the node NODE1 does not reach the threshold value of the Schmitt trigger S11 due to the RC charge/discharge circuit configured with the resistive element P11 and the capacitor C2, and it is then discharged. Therefore, the output of the low pass filter goes to a low state.

That is, the Schmitt trigger S11 outputs a square wave signal of logic high level when the signal inputted through the RC charge/discharge circuit is higher than the preset threshold value (or reference value). However, in accordance with the embodiment of the invention, the output of the Schmitt trigger S11 is inverted, and thus, the Schmitt trigger S11 outputs a low signal. Therefore, the low signal outputted from the Schmitt trigger S11 is again inverted by the inverter IV12 and thus a high signal is generated.

On the contrary, the Schmitt trigger S11 outputs a square wave signal of logic low level when the signal inputted through the RC charge/discharge circuit is lower than the preset threshold value. However, in accordance with the embodiment of the invention, the output of the Schmitt trigger S11 is inverted, and thus, the Schmitt trigger S11 outputs a high signal. In this case, the high signal outputted from the Schmitt trigger S11 is again inverted by the inverter IV12 and thus a low signal is generated.

Therefore, in the above case, the low pass filter outputs the low signal because the signal inputted through the RC charge/discharge circuit is lower than the threshold value.

Meanwhile, when the frequency of the clock is greatly varied, just like in the clock training operation, the resistive element P12 having a large resistance or the capacitor C1 having a large capacitance is selected. When a larger RC delay is needed, the resistive element P12 having a large resistance and the capacitor C1 having a large capacitance are selected at the same time. The following description will be made on the case where the resistive element P12 having a large resistance is selected, and the case where the capacitor C1 having a large capacitance is selected.

The TMRS provides the bandwidth expansion signals BW_CTRL1 and BW_CTRL2 of logic low level. The bandwidth expansion signal BW_CTRL1 of the logic low level turns off the PMOS transistor P11 and turns on the PMOS transistor P12. Therefore, the resistive element becomes turned-on because the PMOS transistor P12 having a large resistance is selected.

In addition, the bandwidth expansion signal BW_CTRL2 of the logic low level is inverted by the inverter IV13 and thus the high signal is provided to the NMOS transistor N12. Thus, the NMOS transistor N12 is turned on. Also, the bandwidth expansion signal BW_CTRL2 of the logic low level turns off the NMOS transistor N13. Therefore, the capacitor C1 becomes operable through the turned-on NMOS transistor N12. Due to the control of the bandwidth expansion signals, the RC charge/discharge circuit is implemented with the resistive element P12 having a large resistance and the capacitor C1 having a large capacitance. The increased resistance and capacitance of the RC charge/discharge circuit increase the RC delay time, thereby expanding the bandwidth of the low pass filter.

When such a control operation is performed, the NMOS transistor N11 or the PMOS transistor P13 are turned on according to the input clock signal of the logic high or low level. The supply voltage passing through the resistive element P12 is supplied to the node NODE1 according to the turn-on characteristics of the turned-on transistors. In this case, the supply voltage supplied to the node NODE1 is charged into the capacitor C1.

Therefore, like the clock training operation, the pulse width of the output signal of the phase frequency detector, which is expanded by the frequency variation of the reference clock signal or the feedback clock signal, is filtered by the low pass filter with the adjusted bandwidth. Therefore, in a period where the pulse width of the input clock signal is long, the voltage applied to the node NODE1 does not reach the threshold value of the Schmitt trigger S11 due to the RC charge/discharge circuit configured with the resistive element P12 and the capacitor C1, and it is again discharged. Therefore, the output of the low pass filter becomes low.

That is, the Schmitt trigger S11 outputs a square wave signal of logic high level when the signal inputted through the RC charge/discharge circuit is higher than the preset threshold value (or reference value). However, in accordance with the embodiment of the invention, the output of the Schmitt trigger S11 is inverted, and thus, the Schmitt trigger S11 outputs a low signal. Therefore, the low signal outputted from the Schmitt trigger S11 is again inverted by the inverter IV12 and thus a high signal is generated.

On the other hand, when the signal inputted through the RC charge/discharge circuit is lower than the present threshold value, the Schmitt trigger S11 outputs a square wave signal of logic low level. However, in accordance with the embodiment of the invention, the output of the Schmitt trigger S11 is inverted, and thus, the Schmitt trigger S11 outputs a high signal. In this case, the high signal outputted from the Schmitt trigger S11 is again inverted by the inverter IV12 and thus a low signal is generated.

Therefore, in the above case, the low pass filter outputs the low signal because the signal inputted through the RC charge/discharge circuit is lower than the threshold value.

That is, in the low pass filter in accordance with the embodiment of the invention, the lock detector circuit filters the input pulse signal in the period where the pulse width is short. Since the output signals UP and DN of the phase frequency detector, which have the long pulse width, are inputted to the low pass filter when the phase locked loop is in the unlocking state, the low pass filter does not filter the signals sufficiently and outputs the high signal. The generated high signal indicates that the lock detector circuit is in the unlocking state.

On the contrary, since the output signals UP and DN of the phase frequency detector, which have the short pulse width, are inputted to the low pass filter when the phase locked loop is in the locking state, the low pass filter filters the signals sufficiently and outputs the low signal. The generated low signal indicates that the lock detector circuit is in the locking state.

Furthermore, even in the locking state of the phase locked loop, the low pass filter configured to filter only the short pulse width is difficult to perform the filtering operation as much as desired in the period where the frequency variation greatly occurs according to the characteristic of the memory device, like the clock training operation. In this case, the low pass filter in accordance with the embodiment of the invention performs the bandwidth adjustment to increase the resistance and the capacitance so that the low pass filter can perform the filtering operation on the desired pulse even in the operation where the frequency variation is great.

Figure 6:
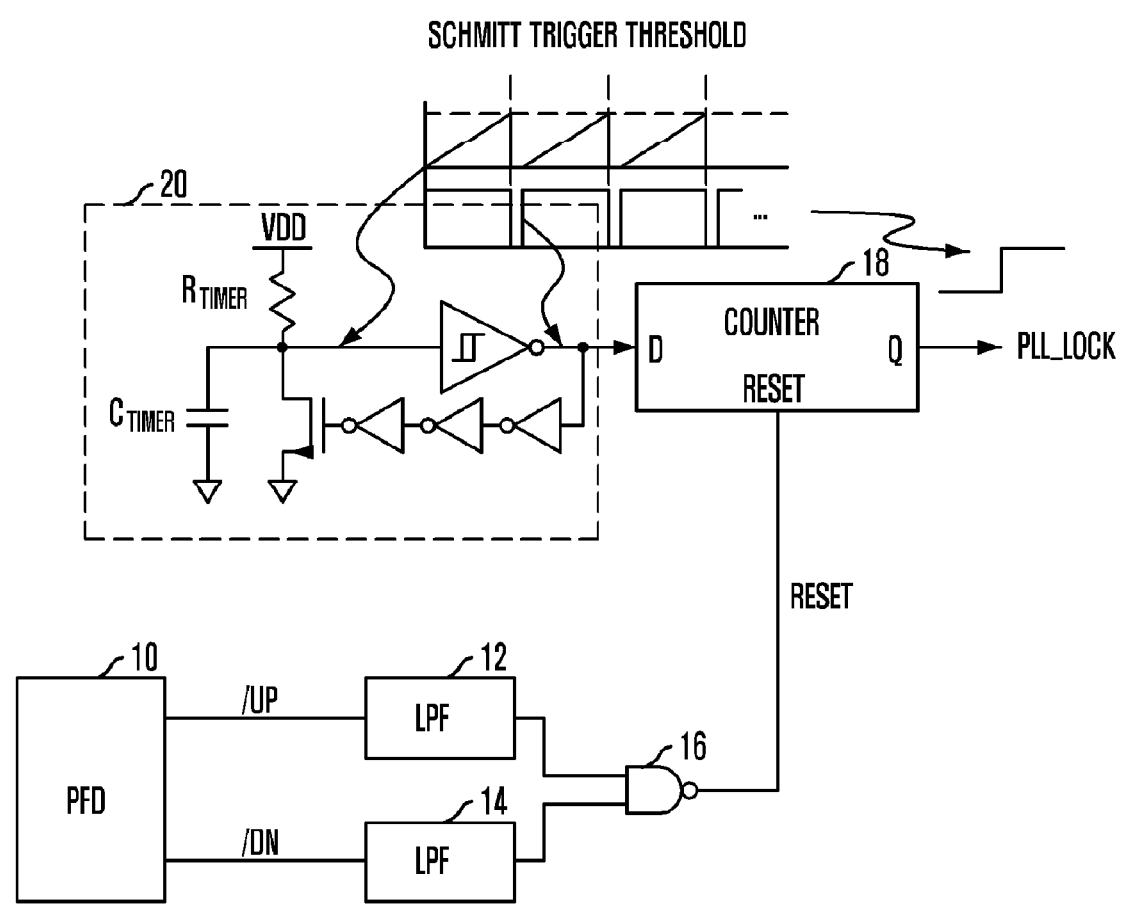
FIG. 6 is a detailed circuit diagram of a lock detector circuit in accordance with an embodiment of the invention.

FIG. 6 illustrates a detailed structure of the lock detector circuit in accordance with an embodiment of the invention.

Referring to FIG. 6, the lock detector circuit includes a phase frequency detector 10, a low pass filter 12, and a low pass filter 14. The phase frequency detector 10 generates an up signal (high state) or a down signal (low state) in a locking state or an unlocking state of the phase locked loop. The low pass filter 12 receives the pulse signal based on the up signal generated from the phase frequency detector 10 and removes the pulse signal having a pulse width within the set RC value. The low pass filter 14 receives the pulse signal based on the down signal generated from the phase frequency detector 10 and removes the pulse signal having a pulse width within the set RC value.

As illustrated in FIG. 5, the low pass filters 12 and 14 can selectively vary the bandwidth. In particular, the bandwidth of the low pass filter is set relatively larger than the normal operation in the PLL locking state in the clock training operation or the operation in which the frequency greatly varies like the case where jitter is increased due to the unstable external voltage.

In addition, a NAND gate 16 performs a NAND operation on the outputs of the two low pass filters 12 and 14. A counter 18 is reset by an output of the NAND gate 16. A timer 20 outputs a high signal as an enable signal after a certain toggling. The counter 18 counts the toggling number of the timer 20, and outputs the enable signal after a certain time according to the toggling number, so that the locking of the phase locked loop is indicated to the next circuit.

An operation of the lock detector circuit in accordance with the embodiment of the invention will be described below.

The lock detector circuit may operate in one of the three scenarios: the locking state, the unlocking state, and the scenario under which the frequency variation is great as in the clock training operation although it is in the locking state.

First, in the general locking state, the locking signal is generated at constant periods. That is, the up signal UP and the down signal DN outputted from the phase frequency detector 10 have constant pulse widths. Therefore, the low pass filters 12 and 14 perform the filtering operation sufficiently according to the set RC delay value, and thus do not generate the reset signal. Thus, the counter 18 normally counts the toggling value of the timer 20, without the influence of the reset signal, and generates the PLL locking signal when the count value becomes a certain value.

In the unlocking state, the reset signal is continuously generated. Thus, the locking signal is not generated. That is, in the unlocking state, the pulse width of the up signal or the down signal outputted from the phase frequency detector 10 becomes very irregular. In this case, the low pass filters 12 and 14 cannot completely perform the filtering operation due to the set RC delay value. Therefore, the NAND gate 16 configured to perform the NAND operation on the outputs of the low pass filters 12 and 14 generates the reset signal irregularly. The generated reset signal resets the counter 18. Thus, the counter 18 cannot generate the toggling signal of the timer 20 at constant periods and thus the generation of the PLL locking signal is blocked.

When the frequency variation is great as in the clock training operation, although it is in the locking state, the RC delay value of the low pass filter is increased. That is, as illustrated in FIG. 5, the value of the RC charge/discharge circuit is increased by variably controlling the resistance of the resistive element or the capacitance of the capacitor. The increased RC delay value is adjusted to a value at which the input pulse can be sufficiently filtered. Compared with the general locking state, the RC charge/discharge circuit value is set to a relatively large value.

After adjusting the RC value of the low pass filter, the up signal or the low signal outputted from the phase frequency detector 10 is sufficiently filtered at the low pass filters 12 and 14, so that the counter 18 normally toggles the timer 20 at constant periods.

The embodiments of the invention have been provided only for exemplary purposes, and can be applied to the case where the bandwidth of the low pass filter is variably adjusted. Therefore, it will be apparent to those skilled in the art that various changes and modifications may be made without departing from the spirit and scope of the invention as defined in the following claims.

As an example, although the two cases of bandwidth adjustment have been described in the aforementioned embodiments, the invention is not limited to those embodiments. Resistive elements and capacitors may be further provided for the bandwidth adjustment, and the bandwidth can be adjusted properly according to circumstances.

Furthermore, the constitution of the resistive element for the bandwidth adjustment is not limited to MOS transistors. Any resistive element can also be applied.

In accordance with the embodiments of the invention, the bandwidth of the low pass filter is adjusted when the frequency variation of the clock signal is great like in the data training operation although it is in the PLL locking state. Accordingly, the filtering of the pulse signal is controlled by adjusting the bandwidth to be short in the general locking state, and the sufficient filtering is performed by adjusting the bandwidth of the low pass filter to be long when the frequency variation of the clock signal is great like the data training operation although it is in the locking state. In addition, since the low pass filter with the adjustable bandwidth is used, the stable PLL locking signal is generated and the erroneous operation of the lock detector circuit is prevented.

What is claimed is:

1. A low pass filter, comprising:
   a driver unit configured to output a voltage proportional to an input pulse width;
   a charge/discharge unit configured to charge the output voltage of the driver unit;
   a comparator unit configured to compare the charged output voltage of the charge/discharge unit with a reference value to output a square wave signal; and
   a switching unit configured to switch the charge/discharge unit to an operation state, based on a bandwidth expansion signal,
   wherein the charge/discharge unit includes two or more capacitors having different capacitances and connected between the driver unit and the comparator unit, and at least one resistive element connected between a power supply voltage terminal and the driver unit.

2. The low pass filter of claim 1, wherein the driver unit includes a PMOS transistor and an NMOS transistor connected in series between the at least one resistive element and a ground voltage terminal.

3. The low pass filter of claim 1, wherein the at least one resistive element includes a plurality of resistive elements having different resistances.

4. The low pass filter of claim 3, wherein the plurality of resistive elements comprise PMOS transistors.

5. The low pass filter of claim 3, wherein the switching unit comprises:
   a first switch configured to switch one of the plurality of resistive elements to the operation state using a first bandwidth expansion control signal;
   a second switch configured to control a first capacitor of the charge/discharge unit using a second bandwidth expansion control signal; and
   a third switch configured to control a second capacitor of the charge/discharge unit using the second bandwidth expansion control signal.

6. A lock detector circuit, comprising:
   a phase frequency detector configured to output pulse signals;
   a first low pass filter configured to adjust a first bandwidth according to a first bandwidth expansion signal and filter a first pulse signal of the pulse signals outputted from the phase frequency detector according to the adjusted first bandwidth;
   a second low pass filter configured to adjust a second bandwidth according to a second bandwidth expansion signal and filter a second pulse signal of the pulse signals outputted from the phase frequency detector according to the adjusted second bandwidth;
   a timer configured to output an enable signal after a predetermined toggling; and
   a counter configured to generate a locking signal after counting a certain number of togglings of the timer using a reset signal based on outputs of the first and second low pass filters.

7. The lock detector circuit of claim 6, further comprising an operation unit configured to perform an operation on the outputs of the first and second low pass filters, and to transmit an operation result as the reset signal to the counter.

8. The lock detector circuit of claim 6, wherein each of the first and second low pass filters includes
   a driver unit configured to output a voltage proportional to an input pulse width;
   a charge/discharge unit configured to charge the output voltage of the driver unit;
   a comparator unit configured to compare the charged output voltage of the charge/discharge unit with a reference value to output a square wave signal; and
   a switching unit configured to switch the charge/discharge unit to an operation state, based on the filter's corresponding first or second bandwidth expansion signal.

9. The lock detector circuit of claim 8, wherein each of the first and second low pass filters further includes an inverter configured to invert the square wave signal.

10. The lock detector circuit of claim 8, the circuit has a plurality of operation states including a clock training operation state, wherein the first and second bandwidth expansion signals are generated in the clock training operation state.

11. The lock detector circuit of claim 8, wherein the charge/discharge unit includes a capacitor connected between the driver unit and the comparator unit.

12. The lock detector circuit of claim 11, wherein the charge/discharge unit further comprises a resistive element connected between a power supply voltage terminal and the driver unit.

* * * * *